United States Patent
Chuo et al.

(10) Patent No.: US 10,098,224 B1
(45) Date of Patent: Oct. 9, 2018

(54) REINFORCEMENT COMPONENTS FOR ELECTRICAL CONNECTIONS WITH LIMITED ACCESSIBILITY AND SYSTEMS AND METHODS FOR MAKING THE SAME

(71) Applicant: Apple Inc., Cupertino, CA (US)

(72) Inventors: Yindar Chuo, San Jose, CA (US); Nathan K. Gupta, San Francisco, CA (US); Po-Jui Chen, Taichung (TW); Wei Lin, Santa Clara, CA (US); Wei-Hao Sun, Taipei (TW); Jui-Ming Yang, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/871,585

(22) Filed: Jan. 15, 2018

Related U.S. Application Data

(60) Provisional application No. 62/565,575, filed on Sep. 29, 2017.

(51) Int. Cl.
| | |
|---|---|
| *H05K 1/00* | (2006.01) |
| *H05K 1/02* | (2006.01) |
| *H01R 12/77* | (2011.01) |
| *H01R 12/59* | (2011.01) |
| *H05K 1/03* | (2006.01) |
| *B32B 38/00* | (2006.01) |
| *H01R 43/02* | (2006.01) |

(52) U.S. Cl.
CPC ....... *H05K 1/0281* (2013.01); *B32B 38/0012* (2013.01); *H01R 12/592* (2013.01); *H01R 12/775* (2013.01); *H01R 43/0256* (2013.01); *H05K 1/0353* (2013.01); *H05K 1/0393* (2013.01)

(58) Field of Classification Search
CPC ............... H01R 12/592; H01R 12/775; H01R 43/0256; H05K 1/0281; H05K 1/0353; H05K 1/0393; B32B 38/0012
USPC .......................................... 174/254; 361/749
See application file for complete search history.

(56) References Cited

U.S. PATENT DOCUMENTS

| | | | | |
|---|---|---|---|---|
| 5,895,970 | A * | 4/1999 | Miyoshi | H01L 23/3107 257/696 |
| 2008/0122054 | A1* | 5/2008 | Szewerenko | H01L 23/3128 257/679 |

(Continued)

*Primary Examiner* — Sherman Ng
(74) *Attorney, Agent, or Firm* — Van Court & Aldridge LLP

(57) ABSTRACT

Reinforcement components for electrical connections with limited accessibility Shield structures with reduced spacing between adjacent insulation components and systems and methods for making the same are provided. In some embodiments, a reinforcement component may be compressed between two portions of a first electronic component in order to deform the reinforcement component for filling in a void between the reinforcement component and a coupling formed between the first electronic component and a second electronic component. The first electronic component may be a flexible circuit component that may be folded over the reinforcement component prior to the reinforcement component being compressed. This may enable the reinforcement component to be effectively positioned with respect to the first electronic component prior to being deformed for reinforcing one or more couplings made between the first electronic component and the second electronic component.

20 Claims, 13 Drawing Sheets

(56) References Cited

U.S. PATENT DOCUMENTS

| | | | |
|---|---|---|---|
| 2011/0133315 A1* | 6/2011 | Pahl | B81B 7/0048 257/659 |
| 2015/0189740 A1* | 7/2015 | Kido | H05K 1/0281 174/254 |

* cited by examiner

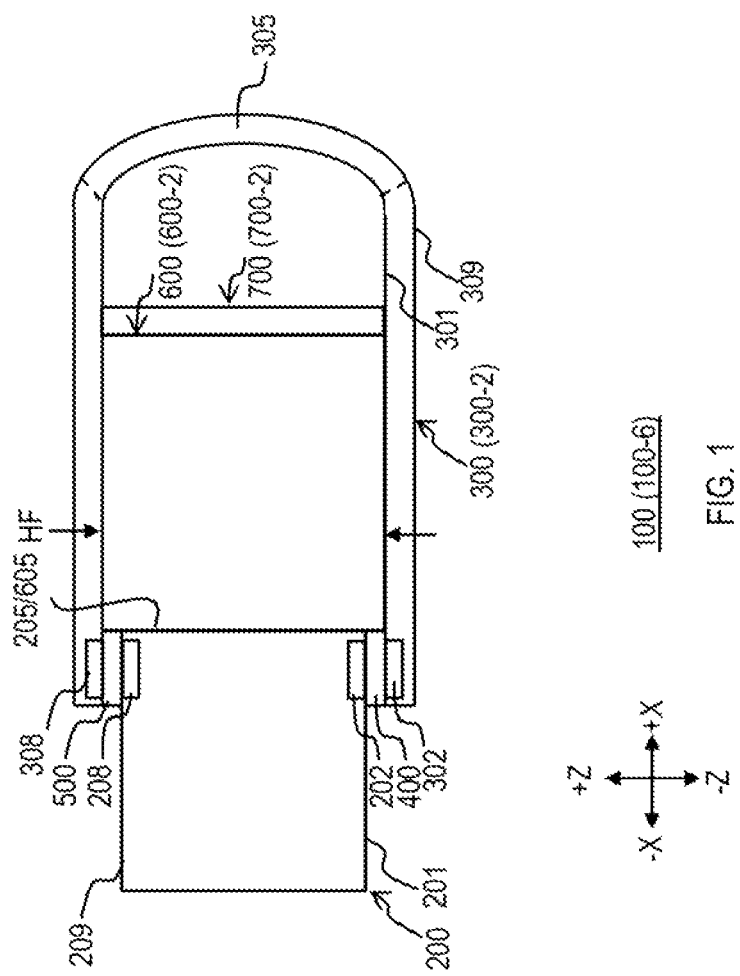

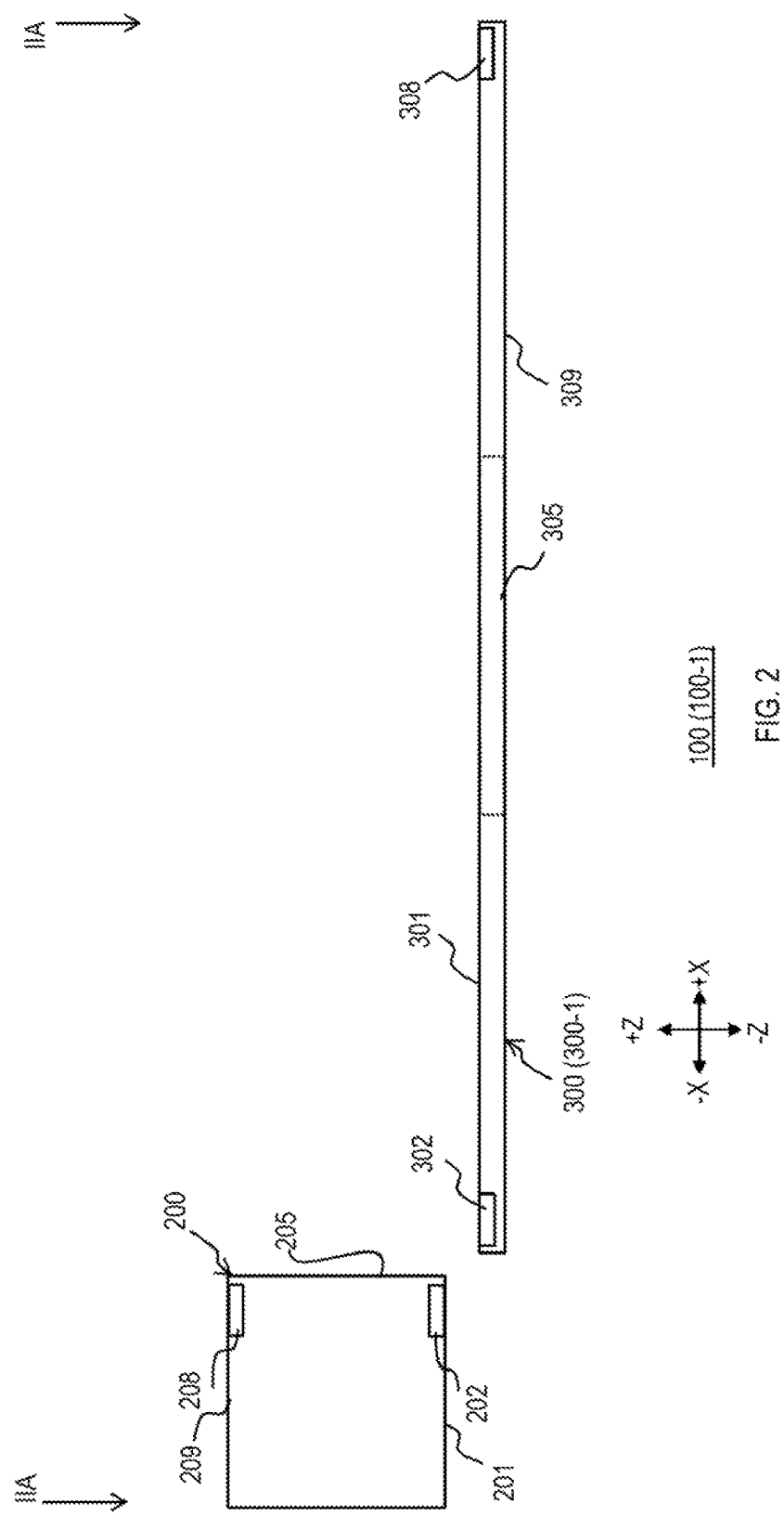

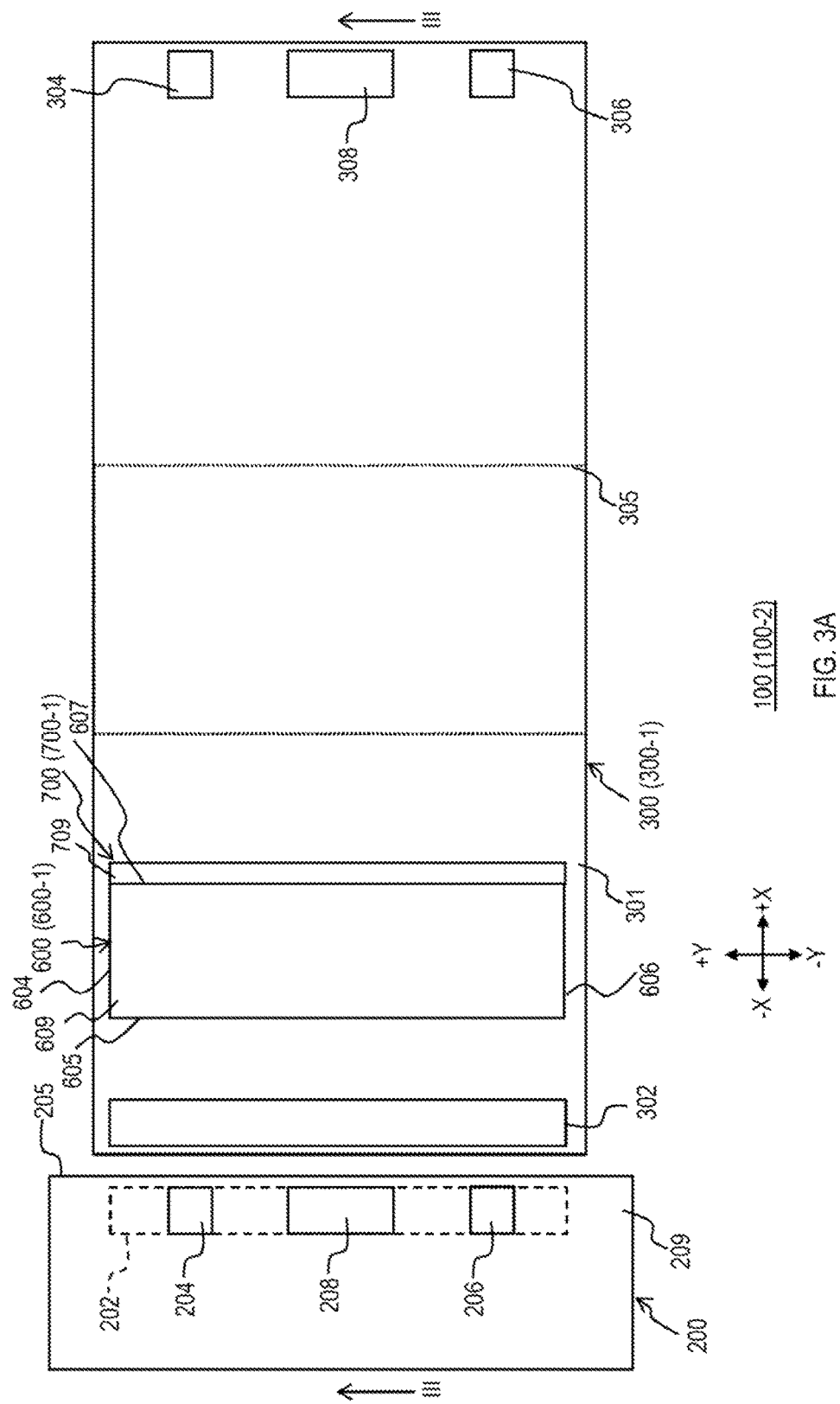

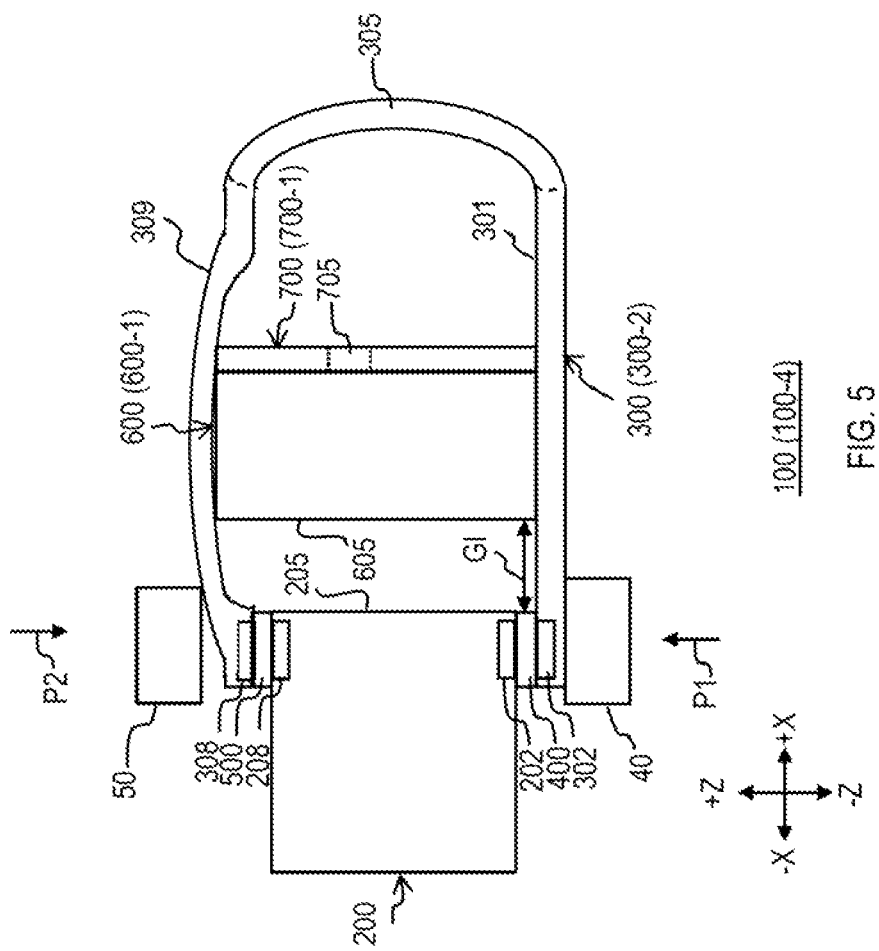

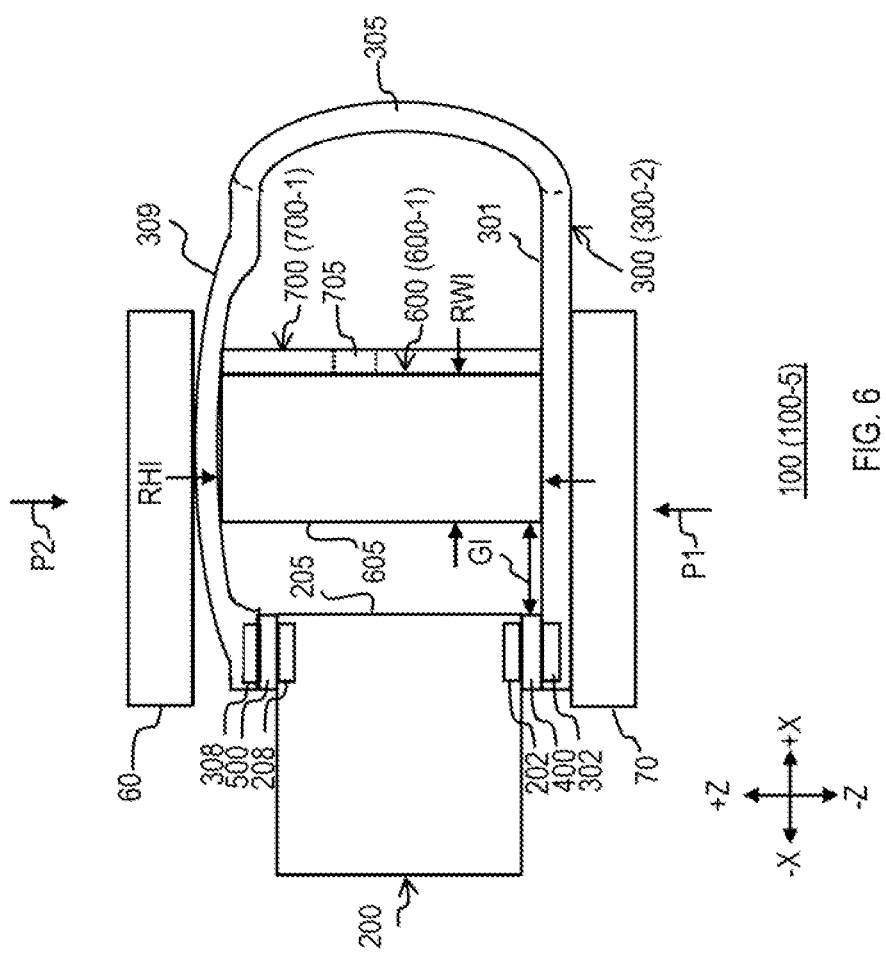

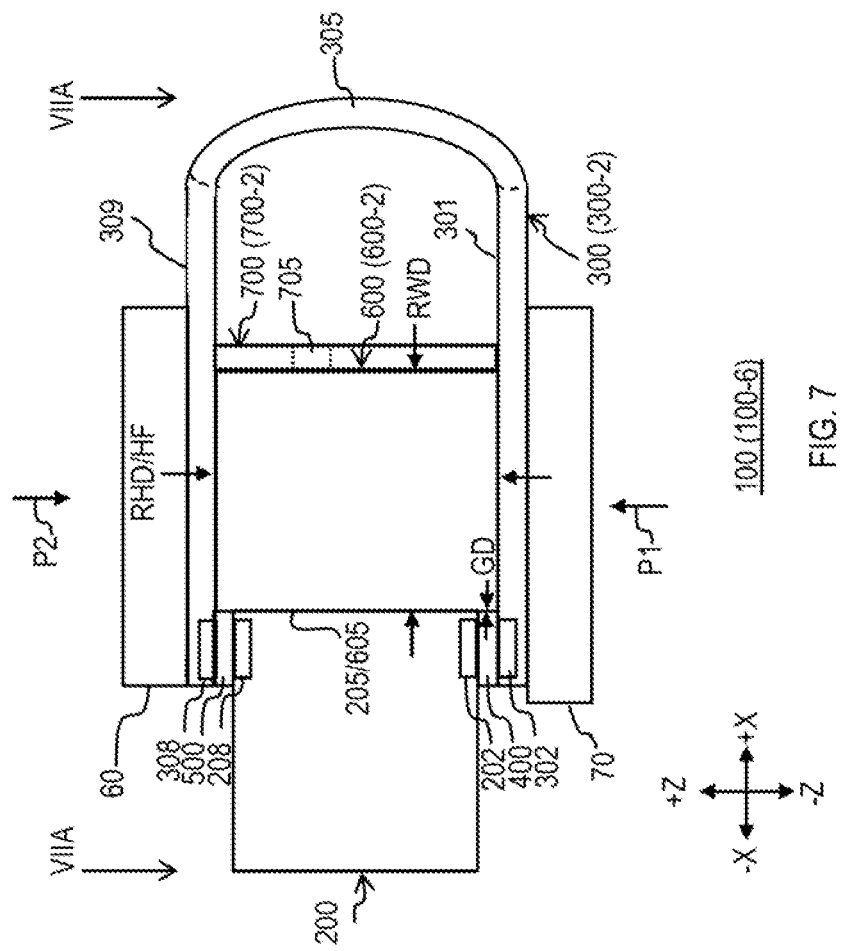

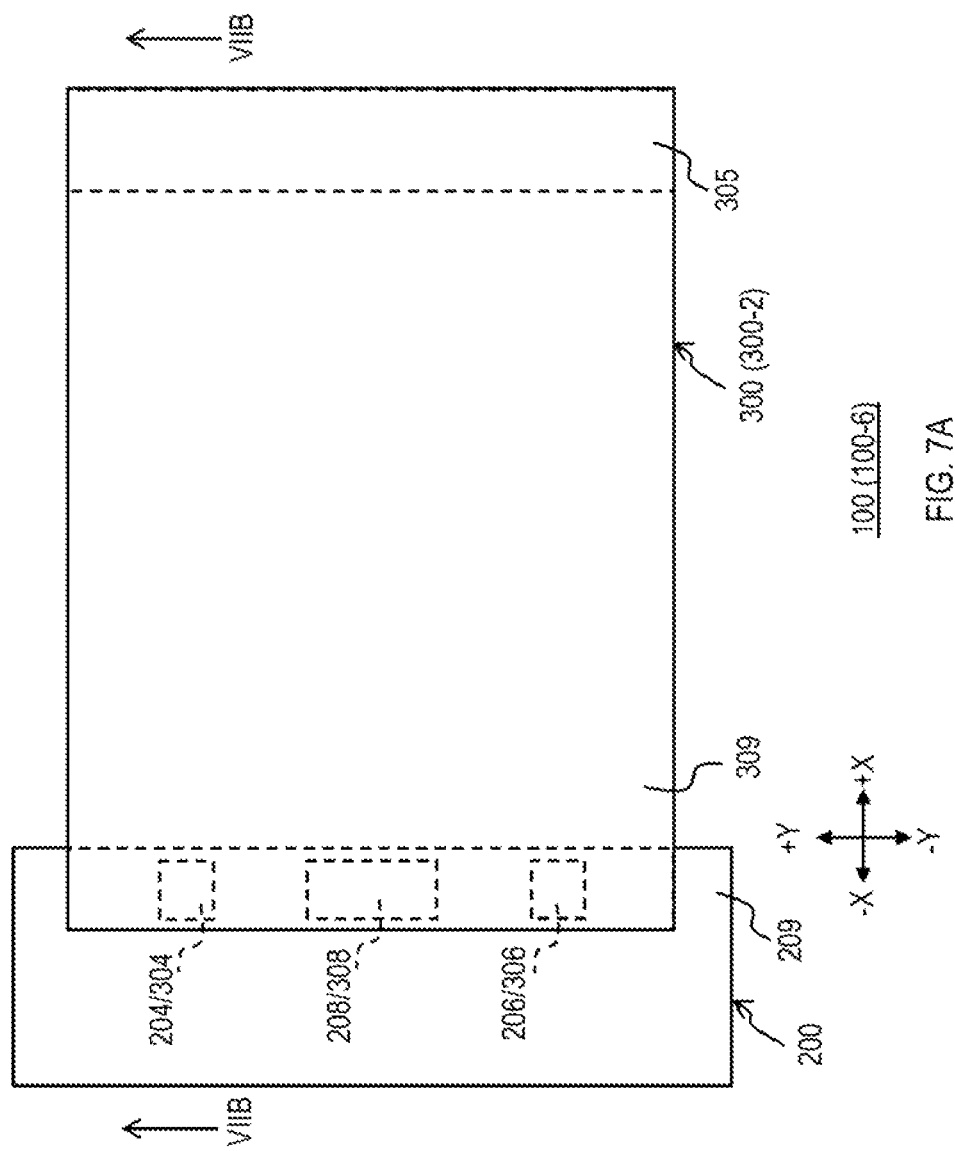

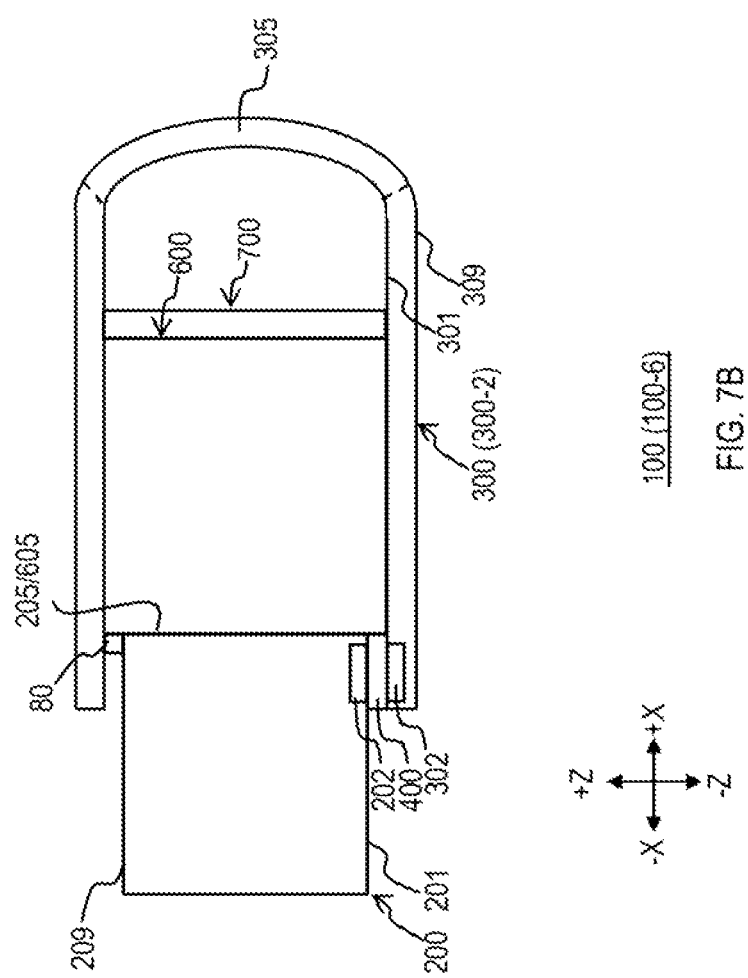

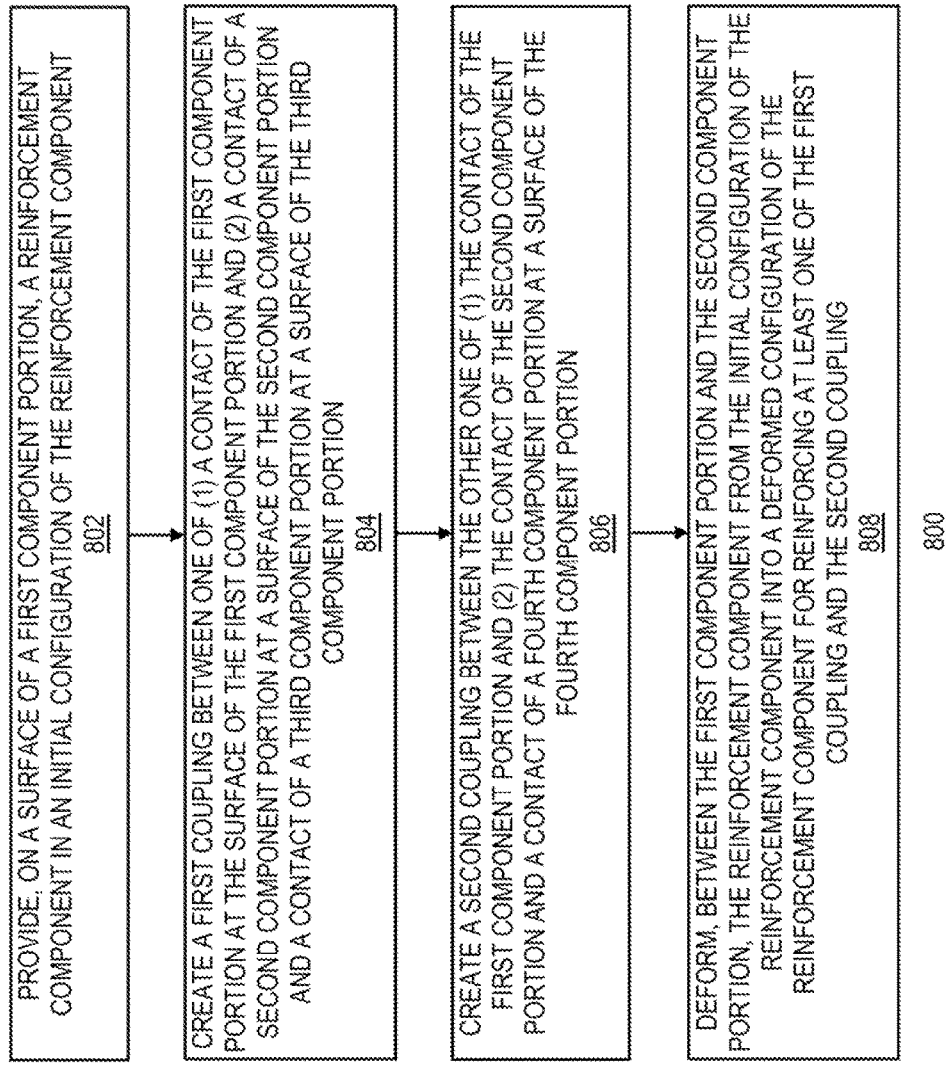

REINFORCEMENT COMPONENTS FOR ELECTRICAL CONNECTIONS WITH LIMITED ACCESSIBILITY AND SYSTEMS AND METHODS FOR MAKING THE SAME

CROSS-REFERENCE TO RELATED APPLICATION(S)

This application claims the benefit of prior filed U.S. Provisional Patent Application No. 62/565,575, filed Sep. 29, 2017, which is hereby incorporated by reference herein in its entirety.

TECHNICAL FIELD

This disclosure relates to reinforcement components and, more particularly, to reinforcement components for electrical connections with limited accessibility and systems and methods for making the same.

BACKGROUND OF THE DISCLOSURE

A conventional reinforcement component may be formed by injecting a liquid material into a target location adjacent an electrical connection that has already been made between two electronic components, and then by curing the injected liquid material to provide a strong mechanical support for the electrical connection at the target location. However, the accessibility to such a target location is often too small to enable the introduction of a reinforcement component at the target location.

SUMMARY OF THE DISCLOSURE

Reinforcement components for electrical connections with limited accessibility and systems and methods for making the same are provided.

As an example, a method for protecting at least one of a plurality of couplings is provided, wherein the plurality of couplings includes a first coupling between a first flexible circuit contact of a first flexible circuit surface of a first flexible circuit portion and a first component contact of a first component surface of a component and a second coupling between a second flexible circuit contact of a second flexible circuit surface of a second flexible circuit portion and a second component contact of a second component surface of the component, wherein the method may include providing a reinforcement component on one of the first flexible circuit surface and the second flexible circuit surface and, after the providing, compressing the reinforcement component between the first flexible circuit surface and the second flexible circuit surface, wherein the compressed reinforcement component reinforces at least one of the first coupling and the second coupling.

As another example, a method for forming a system with at least one reinforced coupling includes providing, on a surface of a first component portion, a reinforcement component in an initial configuration of the reinforcement component, creating a first coupling between one of a contact of the first component portion at the surface of the first component portion and a contact of a second component portion at a surface of the second component portion and a contact of a third component portion at a surface of the third component portion, creating a second coupling between the other one of the contact of the first component portion and the contact of the second component portion and a contact of a fourth component portion at a surface of the fourth component portion, and deforming, between the first component portion and the second component portion, the reinforcement component from the initial configuration of the reinforcement component into a deformed configuration of the reinforcement component for reinforcing at least one of the first coupling and the second coupling.

As yet another example, an assembly may include a first electronic component including a first contact on a top surface of the first electronic component and a second contact on a bottom surface of the first electronic component, a second electronic component including a third contact on a first portion of a surface of the second electronic component and a fourth contact on a second portion of the surface of the second electronic component, and a reinforcement component held between the first portion of the surface of the second electronic component and the second portion of the surface of the second electronic component, wherein the first contact is coupled to the third contact at a first coupling, wherein the second contact is coupled to the fourth contact at a second coupling, and wherein a maximum height gap between the first portion of the surface of the second electronic component and the second portion of the surface of the second electronic component is defined by a height between the first coupling and the second coupling.

This Summary is provided only to present some example embodiments, so as to provide a basic understanding of some aspects of the subject matter described in this document. Accordingly, it will be appreciated that the features described in this Summary are only examples and should not be construed to narrow the scope or spirit of the subject matter described herein in any way. Unless otherwise stated, features described in the context of one example may be combined or used with features described in the context of one or more other examples. Other features, aspects, and advantages of the subject matter described herein will become apparent from the following Detailed Description, Figures, and Claims.

BRIEF DESCRIPTION OF THE DRAWINGS

The discussion below makes reference to the following drawings, in which like reference characters may refer to like parts throughout, and in which:

FIG. 1 is a cross-sectional view of an illustrative system that includes a reinforcement component for an electrical connection;

FIG. 2 is a cross-sectional view, similar to FIG. 1, of a first stage of assembly of the system of FIG. 1, taken from line II-II of FIG. 2A;

FIG. 3A is a top view, similar to FIG. 2A, of the second stage of assembly of FIG. 3 of the system of FIG. 1, taken from line IIIA-IIIA of FIG. 3;

FIG. 5 is a cross-sectional view, similar to FIGS. 1, 2, 3, and 4, of a fourth stage of assembly of the system of FIG. 1;

FIG. 6 is a cross-sectional view, similar to FIGS. 1, 2, 3, 4, and 5, of a fifth stage of assembly of the system of FIG. 1;

FIG. 7 is a cross-sectional view, similar to FIGS. 1, 2, 3, and 6, of a sixth stage of assembly of the system of FIG. 1;

FIG. 7A is a top view, similar to FIGS. 2A and 3A, of the sixth stage of assembly of FIG. 7 of the system of FIG. 1, taken from line VIIA-VIIA of FIG. 7;

FIG. 7B is another cross-sectional view, similar to FIGS. 1, 2, 3, 4, 5, 6, and 7, of the sixth stage of assembly of FIGS. 7 and 7A of the system of FIG. 1, taken from line VIIB-VIIB of FIG. 7A; and FIGS. 8 and 9 are flowcharts of illustrative processes for reinforcing an electrical coupling.

DETAILED DESCRIPTION OF THE DISCLOSURE

Figure 2A:
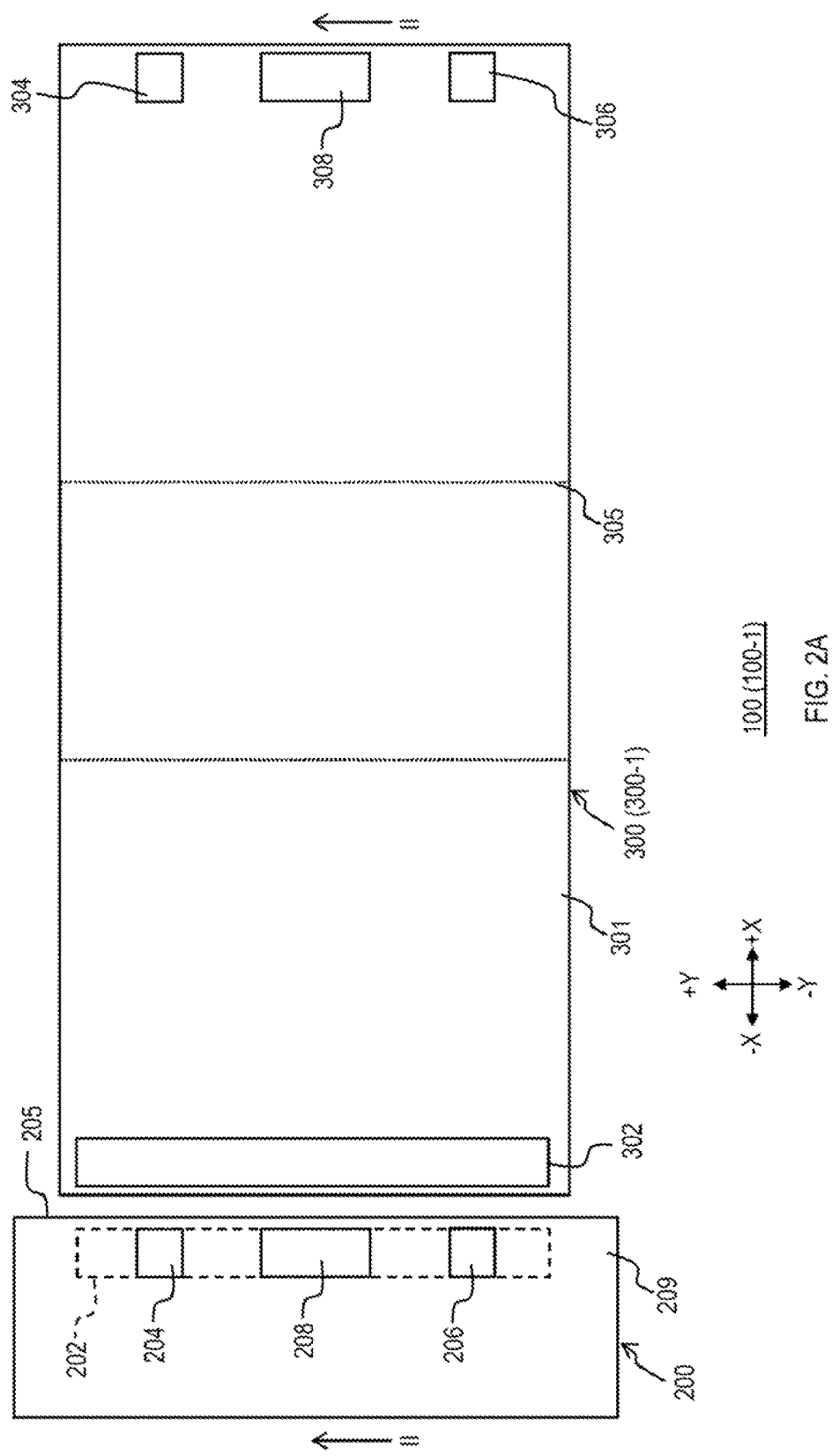
FIG. 2A is a top view of the first stage of assembly of FIG. 2 of the system of FIG. 1, taken from line IIA-IIA of FIG. 2.

Reinforcement components for electrical connections and systems and methods for making the same are provided and described with reference to FIGS. 1-9.

A reinforcement component may be compressed between two portions of a first electronic component in order to deform the reinforcement component for filling in a void between the reinforcement component and a coupling formed between the first electronic component and a second electronic component. The first electronic component may be a flexible circuit component that may be folded over the reinforcement component prior to the reinforcement component being compressed. This may enable the reinforcement component to be effectively positioned with respect to the first electronic component prior to being deformed for reinforcing one or more couplings made between the first electronic component and the second electronic component.

A reinforcement component may be provided for reinforcing one or more electrical connections of any suitable system. For example, as shown in FIG. 1, a system 100 may include a first electronic component 200 and a second electronic component 300 that may be electrically coupled to one another via a first electrical coupling component 400. System 100 may also include a reinforcement component 600 that may be operative to protect or otherwise reinforce the electrical connection between electronic components 200 and 300 via electrical coupling component 400. Additionally, in some embodiments, as shown, reinforcement component 600 may also be operative to protect or otherwise reinforce at least one other electrical connection, such as another electrical connection between electronic components 200 and 300 via a second electrical coupling component 500. First electrical coupling component 400 may be at least partially positioned between, and electrically couple, a first electrical contact 202 of first electronic component 200 to a first electrical contact 302 of second electronic component 300, where electrical contact 202 may be provided on or at a bottom surface 201 of first electronic component 200, and where electrical contact 302 may be provided on or at a first portion of first surface 301 of second electronic component 300. Second electrical coupling component 500 may be at least partially positioned between, and electrically couple, a second electrical contact 208 of first electronic component 200 to a second electrical contact 308 of second electronic component 300, where electrical contact 208 may be provided on or at a top surface 209 of first electronic component 200, and where electrical contact 308 may be provided on or at a second portion of first surface 301 of second electronic component 300. As shown, surfaces 201 and 209 may be on opposite sides of first electronic component 200, where a side surface 205 of first electronic component 200 may extend between surfaces 201 and 209. In such embodiments, second electronic component 300 may include at least one flexible portion, such as a flexible portion 305 (e.g., between the portion of component 300 with contact 302 and the portion of component 300 with contact 308), that may be operative to enable a portion of electronic component 300 to bend (e.g., about a Y-axis) such that the portion of surface 301 with contact 308 may face the portion of surface 301 with contact 302 in order to enable contacts 302 and 308 to be electrically coupled to contacts 202 and 208 on opposite surfaces 201 and 209 of component 200.

Electronic component 200 may be any suitable component or collection of components, such as any suitable sensor subassembly or circuit board or the like, that may include one or more electrical contacts, such as contacts 202 and 208, each of which may be electrically coupled to an electrical contact of another electronic component, such as contacts 302 and 308 of electronic component 300. Similarly, electronic component 300 may be any suitable component or collection of components, such as any suitable interconnect component or flexible circuit or sensor subassembly or circuit board or the like, that may include one or more electrical contacts, such as contacts 302 and 308, each of which may be electrically coupled to an electrical contact of another electronic component, such as contacts 202 and 208 of electronic component 200. In some particular embodiments, component 200 may be a sensor subassembly, such as a panel touch sensor or force sensor (e.g., a plastic (e.g., polyethylene terephthalate ("PET")) panel and/or film), while component 300 may be any suitable flexible circuit that may include at least one electrical contact that may be electrically coupled to an electrical contact on one side of component 200, if not at least two contacts, each of which may be electrically coupled to different electrical contacts on different sides of component 200 (e.g., as shown in FIGS. 1-7B). Electrical coupling component 400 may be any suitable component that may be operative to couple contact 202 of component 200 electrically and/or physically to contact 302 of component 300, such as any suitable adhesive (e.g., pressure sensitive adhesive ("PSA")), anisotropic conductive film ("ACF"), a thermalplastic, a thermalset (e.g., epoxy), solder, screw, clamp, fastener, and/or the like. Electrical coupling component 500 may be any suitable component that may be operative to couple contact 208 of component 200 electrically and/or physically to contact 308 of component 300, such as any suitable adhesive, ACF, solder, screw, clamp, fastener, and/or the like. In some embodiments, an electrical coupling component may not be needed in order for an electrical coupling to be formed and/or maintained between a contact of component 200 and a contact of component 300, but instead the coupling may be created due to relative geometries and/or any other suitable characteristics of components 200 and 300.

Reinforcement component 600 may be any suitable component that may be positioned adjacent component 200 (e.g., a side surface 605 of reinforcement component 600 may be positioned adjacent side surface 205 of component 200) in order to reinforce at least a portion of at least one electrical coupling of system 100 (e.g., at least a portion of the electrical connection between contacts 202 and 302 of electronic components 200 and 300 via electrical coupling component 400 and/or at least a portion of the electrical connection between contacts 208 and 308 of electronic components 200 and 300 via electrical coupling component 500). In some embodiments, a needle or any other suitable injection mechanism may be positioned at a target location for reinforcing one or more electrical couplings (e.g., between opposing portions of component 300 and adjacent surface 205 of component 200) after the establishment of each one of the connection of contacts 202 and 302 and the connection of contacts 208 and 308 in order to dispense in that target location a material (e.g., a liquid resin) that may then be cured into a final structure for providing reinforcement component 600. However, accessibility to such a target location may be limited or non-existent, such as due to a limited height HF between opposing portions of surface 301 of component 300 that may prevent an injection mechanism from accessing the target location or that may prevent an injection mechanism from accessing the target location without negatively affecting system 100 (e.g., without bending apart opposing portions of component 300 and damaging the electrical couplings). Therefore, other approaches may be more reliable for providing reinforcement component 600 for reinforcing one or more electrical couplings, such as one or more couplings with limited accessibility (e.g., between two opposing component surfaces). As just one example, height HF may be on the order of or less than 180 micrometers (e.g., where component 200 may have a Z-height of equal to or less than 150 micrometers and each one of coupling components 400 and 500 may have a Z-height equal to or less than 15 micrometers). It is to be noted that, although height HF is shown in FIG. 1 to be defined between different portions of surface 301 of a single component 300 that may be electrically coupled to top and bottom surfaces of component 200, this is just exemplary, and such a limiting geometry and/or accessibility for reinforcement component 600 may be defined by any suitable surfaces of any suitable system, such as by opposing surfaces of two different components, where none, one, or both surfaces may provide a contact of an electrical coupling to be reinforced by reinforcement component 600.

Reinforcement component 600 may be any suitable component that may be operative to deform after being positioned on component 300 in order to protect or otherwise reinforce at least a portion of at least one electrical coupling of system 100 (e.g., at least a portion of the electrical connection between electronic components 200 and 300 via electrical coupling component 400 and/or at least a portion of the electrical connection between electronic components 200 and 300 via electrical coupling component 500). For example, reinforcement component 600 may be a deposit of any suitable material that may be coupled to or otherwise positioned in an initial configuration on a portion of component 300 prior to the establishment of at least one of the connection of contacts 202 and 302 and the connection of contacts 208 and 308 (e.g., prior to an event that may limit the accessibility to a target location) such that at least a portion of reinforcement component 600 may be located in between a first portion of surface 301 (e.g., between contact 302 and flexible portion 305) and a second portion of surface 301 (e.g., between flexible portion 305 and contact 308) after the establishment of each one of the connection of contacts 202 and 302 and the connection of contacts 208 and 308 (e.g., after an event that may limit the accessibility to a target location). Reinforcement component 600 may be deformed from its initial configuration to a deformed configuration in order to fill in a void that may exist between the initial reconfiguration of reinforcement component 600 and at least a portion of one or more electrical couplings of system 100 in order to reinforce the electrical coupling(s). For example, reinforcement component 600 may be a dry-film (e.g., a dry-film based gap fill material), such as a thermoplastic adhesive, a special resin base, a thermoplastic (e.g., polyimide), a thermoplastic (e.g., polyester), a thermalplastic (e.g., a thermal bonding film ("TSF")), a thermalset (e.g., a heat activated film ("HAF")), or combination thereof, any B-stage material, a thermoset (e.g., epoxy, acrylic, B-stage thermoset, etc.), or the like, that may be provided in a first configuration on component 300 and then compressed or otherwise deformed (e.g., heated and then cured) into a deformed configuration that may reinforce one or more electrical couplings of system 100. A barrier component 700 may be provided along with reinforcement component 600 in order to at least partially limit or define the manner or direction in which component 600 may be deformed (e.g., to guide a compressed portion of component 600 towards an electrical coupling to be reinforced). Barrier component 700 may be operative to deform (e.g., at least in one direction (e.g., along the Z-axis)) along with reinforcement component 700. For example, barrier component 700 may be made of any suitable materials, such as a foam material 705 that may be surrounded on its top and bottom by pressure sensitive adhesive ("PSA") or the like.

As shown in FIGS. 2-7B, for example, components 200, 300, 400, 500, and/or 700 may be used in conjunction with reinforcement component 600 to form at least a portion of a reinforcement structure for reinforcing at least one electrical connection of system 100. Although FIGS. 2-7B may be described with respect to a process for forming a reinforcement structure for reinforcing one or more electrical couplings between two electronic components, it is to be understood that such FIGS. 2-7B and such a process may be with respect to the formation of any suitable reinforcement structure for reinforcing at least one coupling of any suitable type between any two suitable components.

FIGS. 2 and 2A show assembly 100 in a first stage of assembly (i.e., in a stage 100-1). Assembly 100 may include at least first component 200 and second component 300 that may eventually be coupled together with at least one coupling. As shown, component 200 may include contact 202 at or on surface 201 and contacts 204, 206, and 208 at or on surface 209. Similarly, component 300 may include contact 302 at or on a first portion of surface 301 and contacts 304, 306, and 308 at or on a second portion of surface 301. Component 300 may also include flexible portion 305 (e.g., between the portion of component 300 with contact 302 and the portion of component 300 with contact 308) that may be operative to enable a portion of electronic component 300 to bend (e.g., about a Y-axis) from a first configuration (e.g., a flat configuration 300-1 of stage 100-1 of FIGS. 2 and 2A) to a second configuration (e.g., a folded configuration 300-2 of a final assembly stage 100-6 of FIG. 1) such that the portion of surface 301 with contact 308 may face the portion of surface 301 with contact 302 in order to enable contacts 302 and 308 to be electrically coupled to contacts 202 and 208 on opposite surfaces 201 and 209 of component 200. As shown, contact 302 may extend along a majority of a width of surface 301 (e.g., along the Y-axis) adjacent a first side of component 300 and contact 202 may extend along a similar width of surface 201 of component 200, while contacts 304, 306, and 308 may extend along different portions of a width of surface 301 adjacent a second side of component 300 and contacts 204, 206, and 208 may extend along similar widths of surface 209 of component 200.

Figure 3:
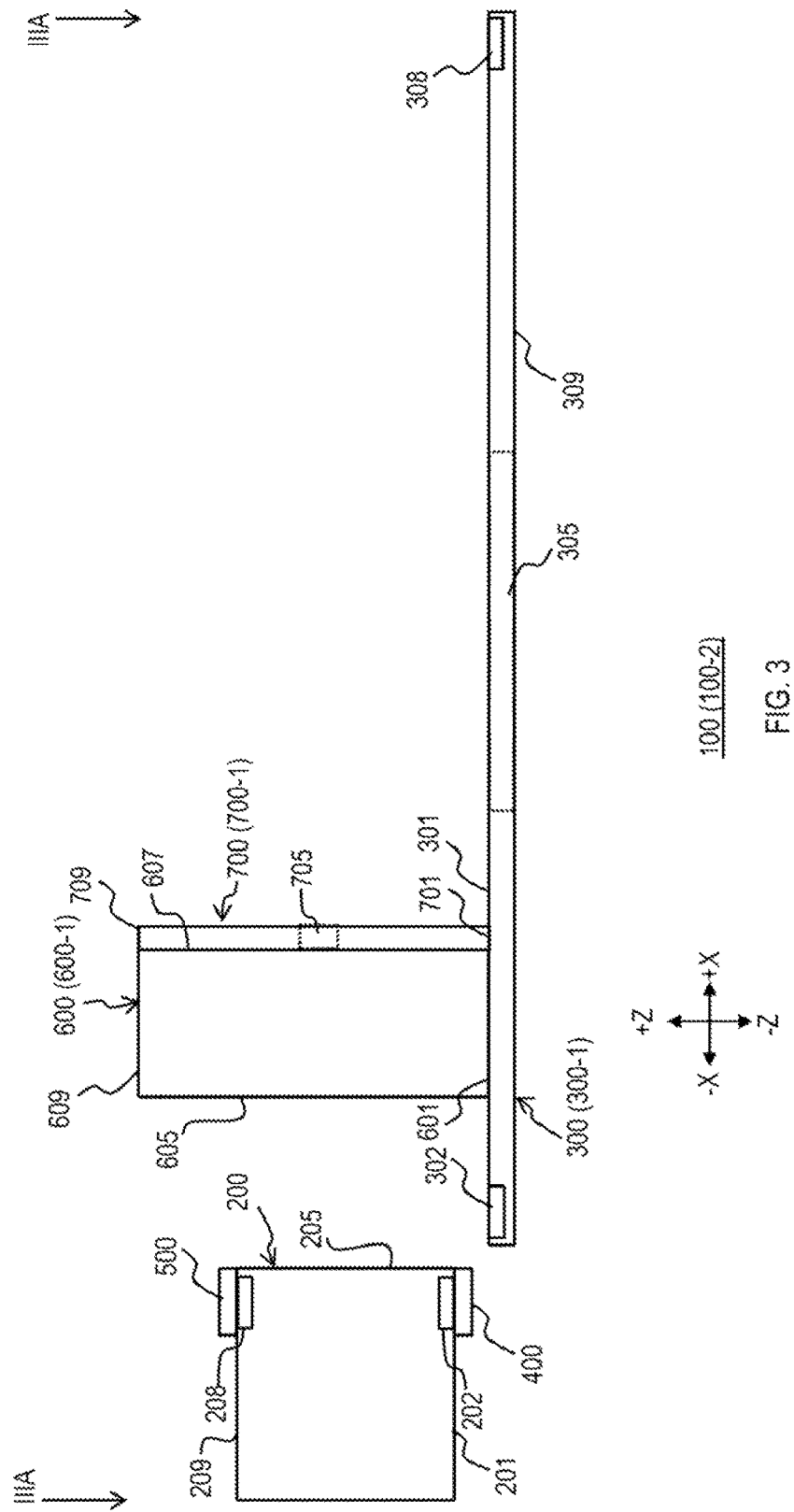
FIG. 3 is a cross-sectional view, similar to FIGS. 1 and 2, of a second stage of assembly of the system of FIG. 1, taken from line of FIG. 3A.

Once first component 200 and second component 300 have been made available in first assembly stage 100-1 of assembly 100, at least one reinforcement component may be provided in an initial configuration of the reinforcement component on at least one surface of second component 300 in the first configuration of second component 300. FIGS. 3 and 3A show assembly 100 in a second stage of assembly (i.e., in a stage 100-2), which may be the same as stage 100-1 of assembly 100 but after reinforcement component 600 in an initial configuration of reinforcement component 600 (e.g., configuration 600-1) has been positioned on surface 301 of second component 300 in the first configuration of second component 300. As shown, reinforcement component 600 may extend between side surfaces 604 and 606 (e.g., along the Y-axis), between side surfaces 605 and 607 (e.g., along the X-axis), and between bottom surface 601 and top surface 609 (e.g., along the Z-axis), where bottom surface 601 may be positioned on surface 301 of component 300, such as at a portion of surface 301 between contact 302 and flex portion 305. The position at which component 600 may be provided on surface 301 of component 300 may be any suitable position, such as a position as close as possible to or otherwise adjacent to a location along surface 301 that will be at a connection between component 300 and component 200 to be reinforced by component 600 (e.g., a connection between contact 302 and contact 202). Initial configuration 600-1 of component 600 may be coupled to surface 301 of component 300 in any suitable manner, such as by any suitable adhesion or lamination process (e.g., a low temperature and/or a low pressure lamination process). Alternatively, initial configuration 600-1 of component 600 may be positioned on (e.g., rested upon) surface 301 of component 300 but not physically connected to component 300 at stage 100-2. Moreover, as shown in FIGS. 3 and 3A, stage 100-2 of assembly 100 may also include an initial configuration of barrier component 700 (e.g., configuration 700-1) extending between a top surface 709 and a bottom surface 701 positioned on surface 301 of second component 300 in the first configuration of second component 300, such as in a position on surface 301 such that a side surface of component 700 may extend adjacent to and/or along surface 607 of component 600. Moreover, as also shown in FIGS. 3 and 3A, stage 100-2 of assembly 100 may also include electrical coupling component 400 being positioned at contact 202 or at contact 302 (not shown), and/or electrical coupling component 500 being positioned at contact 208 or at contact 308 (not shown) to prepare device 200 for being electrically coupled to component 300 (e.g., using any suitable positioning and/or adhering and/or pre-tacking process or the like).

Figure 4:
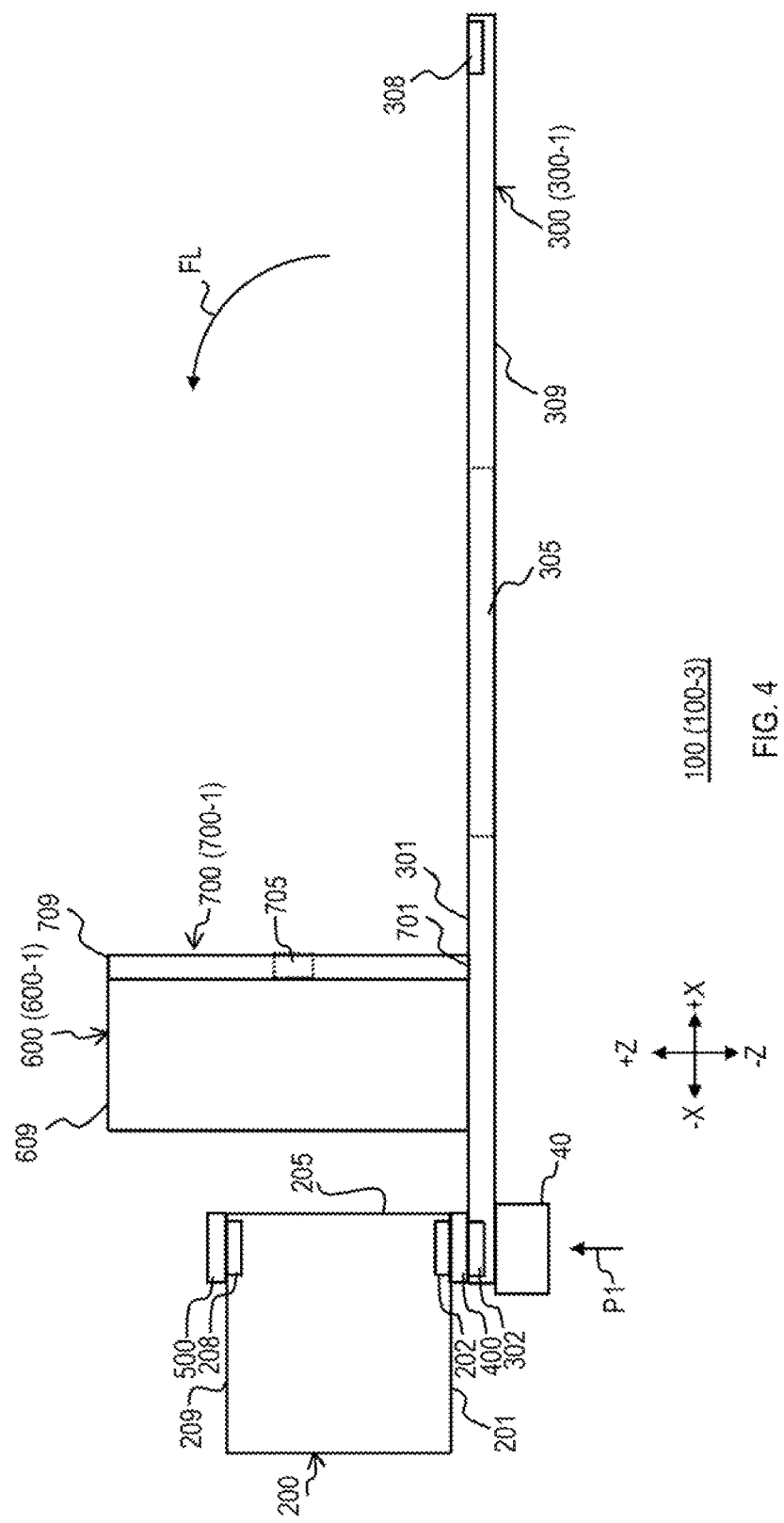
FIG. 4 is a cross-sectional view, similar to FIGS. 1, 2, and 3, of a third stage of assembly of the system of FIG. 1.

Once initial configuration 600-1 of reinforcement component 600 has been positioned on a surface of first configuration 300-1 of component 300 at stage 100-2, one contact of component 300 may be positioned proximate a contact of component 200 for coupling the proximate contacts. FIG. 4 shows assembly 100 in a third stage of assembly (i.e., in a stage 100-3), which may be the same as stage 100-2 of assembly 100 but after contact 302 of component 300 has been positioned proximate contact 202 of component 200 for enabling a coupling therebetween (e.g., via component 400). As shown, a bonding head 40 or any other suitable assembly mechanism may be positioned proximate contacts 202 and 302 (e.g., against surface 309 of component 300 below contact 302) in order to create the coupling between contacts 302 and 202 (e.g., by thermo-bonding contact 302 to contact 202 by flowing and then curing electrical coupling component 400 (e.g., an ACF) between contacts 302 and 202 (e.g., by applying pressure in the direction of arrow P1)). Although stage 100-2 shows reinforcement component 600 positioned on component 300 and then stage 100-3 shows a contact of component 300 positioned adjacent to and potentially coupled to a contact of component 200, it is to be understood that component 600 may be positioned on component 300 after a contact of component 300 is positioned adjacent to and potentially coupled to a contact of component 200.

Once initial configuration 600-1 of reinforcement component 600 has been positioned on a surface of first configuration 300-1 of component 300 and a first contact of component 300 has been positioned proximate and/or coupled to a contact of component 200 at stage 100-3, component 300 may be reconfigured into a second configuration such that another contact of component 300 may be positioned proximate another contact of component 200 for coupling those proximate contacts. FIG. 5 shows assembly 100 in a fourth stage of assembly (i.e., in a stage 100-4), which may be the same as stage 100-3 of assembly 100 but after component 300 has been reconfigured from its first configuration 300-1 to its second configuration 300-2 (e.g., by bending component 300 in the direction of arrow FL of FIG. 4 (e.g., about a Y-axis), such as by using flexible portion 305) such that contact 308 of component 300 may be positioned proximate to contact 208 of component 200 for enabling a coupling therebetween (e.g., via component 400). As shown, a bonding head 50 or any other suitable assembly mechanism may be positioned proximate contacts 208 and 308 (e.g., against surface 309 of component 300 above contact 308) in order to create the coupling between contacts 308 and 208 (e.g., by thermo-bonding contact 308 to contact 208 by flowing and then curing electrical coupling component 500 (e.g., an ACF) between contacts 308 and 208 (e.g., by applying pressure in the direction of arrow P2)).

Once initial configuration 600-1 of reinforcement component 600 has been positioned on a surface of first configuration 300-1 of component 300 and a first contact of component 300 has been positioned proximate and/or coupled to a contact of component 200 at stage 100-3 and component 300 has been reconfigured from its first configuration 300-1 to its second configuration 300-2 such that a second contact of component 300 has been positioned proximate and/or coupled to a second contact of component 200 at stage 100-4, one or more mechanisms may be introduced to deform reinforcement component 600 from its initial configuration 600-1 to a deformed configuration. FIG. 6 shows assembly 100 in a fifth stage of assembly (i.e., in a stage 100-5), which may be the same as stage 100-4 of assembly 100 but after assembly mechanisms 60 and 70 have been introduced to reconfigure reinforcement component 600 from its initial configuration 600-1 to a deformed configuration, while FIGS. 7-7B as well as FIG. 1 show assembly 100 in a sixth stage of assembly (i.e., in a stage 100-6), which may be the same as stage 100-5 of assembly 100 but after assembly mechanisms 60 and 70 have been used to reconfigure reinforcement component 600 from its initial configuration 600-1 to a deformed configuration 600-2. For example, mechanism 60 may be a bonding head or any other suitable assembly mechanism that may be positioned against surface 309 of component 300 above reinforcement configuration 600 while mechanism 70 may be another bonding head or a support stage or any other suitable assembly mechanism that may be positioned against surface 309 of component 300 below reinforcement configuration 600, such that mechanisms 60 and 70 may be utilized to compress or otherwise deform reinforcement component 600 between different portions of component 300 from initial configuration 600-1 to deformed configuration 600-2 (e.g., by thermal bonding reinforcement component 600 to component 300 (e.g., by applying pressure in the direction of arrow P1 and/or in the direction of arrow P2)). Such a reconfiguration by mechanisms 60 and/or 70 may be operative to apply heat in order to activate (e.g., to flow the material of) component 600 and may be operative to apply pressure in order to compress the activated (e.g., flowable) material of component 600 to fill any void(s) that may exist between reinforcement component 600 and one or more couplings between components 200 and 300 to be reinforced by reinforcement component 600 (e.g., a gap of an initial distance GI between surface 605 of component 600 in its initial configuration 600-1 and the coupling between contacts 202 and 302) and may be operative to enable component 600 to cure in its deformed configuration 600-2.

Reconfiguration of reinforcement component 600 from its initial configuration 600-1 to its deformed configuration 600-2 may alter the geometry of component 600, such as from an initial width RWI to a deformed width RWD and from an initial height RHI to a deformed height RHD. As just one example, RWI may be about 1,000 micrometers, while RWD may be about 2,000 micrometers, and RHI may be about 205 micrometers, while RHD (and height HF) may be about 180 micrometers. Barrier component 700 may be operative to deform along its height in the same manner as and along with reinforcement component 600 (e.g., from RHI to RHD), while barrier component 700 may also be operative to prevent or at least partially block the flow of deformed reinforcement component 600 beyond component 700 (e.g., in the +X direction), which may encourage or only allow flow of deformed reinforcement component in the −X direction along the X-axis towards the one or more couplings to be reinforced (e.g., to fill the gap of initial distance GI between surface 605 of component 600 in its initial configuration 600-1 and the coupling between contacts 202 and 302 (e.g., to reduce the gap to a distance GD that may be minimized and/or of no magnitude at all)). Any suitable material or combination of materials may be used to provide reinforcement component 600, although, in some embodiments, it may be preferable to have good flowability during bonding to enable suitable gap filling and/or a modulus and hardness that may be similar to component 200 and/or to component 300 to interface with and/or mechanically reinforce any couplings between component 200 and component 300 in an effective manner and/or a good water vapor transmission rate ("WVTR") for effectively environmentally protecting any couplings between component 200 and component 300 (e.g., from any environmental fluids and/or debris).

Although stage 100-3 may include mechanism 40 operative to bond a first coupling between contacts 202 and 302 via coupling component 400 prior to stage 100-4 that may include mechanism 50 operative to bond a second coupling between contacts 208 and 308 via coupling component 500, and although each of stages 100-3 and 100-4 may occur before stage 100-5 that may include mechanisms 60 and 70 for reconfiguring reinforcement component 600 for reinforcing the first and second couplings, it is to be understood that one or both of the couplings may be bonded at the same time as reinforcement component 600 may be reconfigured from its initial configuration 600-1 to its deformed configuration 600-2. For example, at least coupling component 500 may be bonded between contacts 208 and 308 by mechanism 50 and/or by mechanisms 60 and 70 while reinforcement component is deformed by mechanisms 60 and 70, if not also while coupling component 400 may be bonded between contacts 202 and 302 by mechanism 40 and/or by mechanisms 60 and 70. If the bonding of one or both of the contact couplings is done prior to the reconfiguration of reinforcement component 600, the material(s) of reinforcement component 600 may be configured to withstand the bonding temperature of the prior contact coupling(s) (e.g., the temperature operative to deform reinforcement component 600 may be higher than the temperature operative to flow coupling component 400 and/or coupling component 500), such that the contact coupling bonding does not prematurely flow a portion of component 600, which might cause a portion of the material of deforming component 600 to flow into an area to be used for bonding the contacts of components 200 and 300, thereby negatively affecting the effectiveness of the bonding. Alternatively, if the bonding of one or both of the contact couplings is done simultaneously with the reconfiguration of reinforcement component 600, the material(s) of reinforcement component 600 may be configured to flow at a similar but potentially slightly higher temperature than the bonding temperature of the contact coupling(s) (e.g., the temperature operative to deform reinforcement component 600 may be the same or slightly higher than the temperature operative to flow coupling component 400 and/or coupling component 500), such that the contact coupling bonding does not prematurely flow a portion of component 600, which may cause a portion of the material of deforming component 600 to flow into an area to be used for bonding the contacts of components 200 and 300. For example, in certain embodiments, the bonding material(s) of coupling component 400 and/or of coupling component 500 may be configured to be flowable within a limited flowable temperature range (e.g., when heated between 140° Celsius and 145° Celsius) and to be curable very rapidly thereafter within a limited curing temperature range (e.g., when heated between 145° Celsius and 150° Celsius), while the deformable material(s) of reinforcement component 600 may be configured to be flowable within a limited flowable temperature range just beyond the curing temperature range of the coupling component(s) (e.g., when heated between 150° Celsius and 160° Celsius) and to be curable soon thereafter within a limited curing temperature range (e.g., when heated between 160° Celsius and 170° Celsius). By shifting the flowable temperature range of reinforcement component 600 just beyond the active temperature range of coupling component 400 and/or of coupling component 500 (e.g., to align with the end of the curing temperature range of coupling component 400 and/or coupling component 500), a simultaneous heating process for components 400, 500, and 600 may effectively avoid any reinforcement component 600 from flowing into a coupling location of a coupling component between component contacts while at the same time may effectively enable simultaneous bonding of one or more couplings and deforming of reinforcement component within a limited temperature range, which may avoid applying a temperature that is too far beyond the curing temperature of any component, thereby avoiding any over-curing or baking of any components (e.g., components 400 and/or 500). Material(s) for components 400, 500, and 600 may be chosen such that component 600 may not prematurely cure while a nearby component 400 and/or a nearby component 500 is bonding. Additionally or alternatively, material(s) for components 400, 500, and 600 may be chosen such that component 400 and/or component 500 may not overture while a nearby component 600 is bonded sequentially after the bonding of component 400 and/or component 500. Additionally or alternatively, material(s) for components 400, 500, and 600 may be chosen such that component 600 and at least one of component 400 and component 500 may be bonded simultaneously without negatively affecting any of such bonds. Such a simultaneous heating process for component 600 and at least one of components 400 and 500 may significantly shorten the process for assembling assembly 100 and/or may reduce the assembly mechanisms needed (e.g., mechanisms 60 and 70 may be used for all heating and flowing and curing processes).

As shown in FIGS. 1-7B, a single reinforcement component 600 may be reconfigured not only to reinforce a single coupling (e.g., coupling of contacts 202 and 302) of assembly but also two different couplings that may be aligned with one another on opposite surfaces of component 200 (e.g., a first coupling of contacts 202 and 302 and a second coupling of contacts 208 and 308). Additionally, in some embodiments, as shown, a single reinforcement component 600 may be reconfigured to reinforce two or more different couplings that may be offset from one another along a single surface of component 200 (e.g., a first coupling of contacts 208 and 308 and a second coupling of contacts 206 and 306 and/or a third coupling of contacts 204 and 304). Moreover, in some embodiments, as shown in FIG. 7B, for example, a single reinforcement component 600 may be reconfigured to reinforce a coupling on one surface of component 200 but not on an aligned opposite surface of component 200 (e.g., a portion of a coupling of contacts 202 and 302 on surface 201 but not another coupling of contacts directly thereabove on surface 209). In such an embodiment, any suitable mechanism, such as mechanism 80 of FIG. 7B may be provided along a portion of surface 209 (e.g., adjacent surface 205) to prevent a portion of compressed reinforcement component 600 from flowing and curing on surface 209 during the reconfiguration of component 600. Mechanism 80 may be removed from assembly 100 after component 600 has cured or may remain within assembly 100.

Reinforcement component 600 may be configured to be in a solid state at room temperature in its initial configuration 600-1 prior to being deformed into configuration 600-2 (e.g., prior to being heated for flowing and curing), such that component 600 can be positioned on component 300 prior to one or more additional processes, such as prior to coupling contact 302 of component 300 to contact 202 of component 200 and/or prior to folding component 300 from configuration 300-1 to configuration 300-2 and/or prior to coupling contact 308 of component 300 to contact 208 of component 200. An initial geometry of component 600 of initial configuration 600-1 may be designed such that it may later be compressed to a deformed configuration 600-2 for filling in any suitable voids (e.g., a gap defined by magnitude GI) through application of pressure on component 600 in any suitable direction (e.g., along the Z-axis by reducing the height of component 600, which may thereby increase the width and/or length of component 600 (e.g., along one or both of the X-axis and the Y-axis)). Height RHI may be configured to extend above height HF such that the extra height may be compressed (e.g., in a simultaneous process with bonding coupling component 500 to contacts 208 and 308). Such assembly of assembly 100 may result in a final stage 100-6 that may not be adversely affected by having inserted a material injection mechanism between portions of component 300 after coupling component 300 to component 200 (e.g., in a limited access target area (e.g., as may be defined by height HF)). Therefore, the coupling(s) between component 200 and 300 may not be weakened and/or the manner at which different portions of component 300 may extend away from couplings to component 200 (e.g., in the +X direction) may be parallel to one another and not bent away from one another in any way (e.g., unlike in stage 100-4 of FIG. 5, which may be prior to deformation of component 600 and/or prior to creating one or more couplings between component 200 to component 300). Therefore, different portions of component 300 may extend away from component 200 in a parallel fashion, such that height RHD of configuration 600-2 of component 600 may be substantially consistent along the width and/or length of component 600 (e.g., along one or both of the X-axis and the Y-axis). For example, the largest gap between different portions of surface 301 of component 300 along the Z-axis in the final stage 100-6 of assembly 100 may have a variation of less than a certain percentage of the height between opposing portions of surface 301 at surface 205 of component 200 in the final stage 100-6 of assembly 100 (e.g., less than 10%, or less than 7%, or less than 5%, or less than 3% of the height (e.g., height RHD and/or height HF at surface 205)). Alternatively or additionally, the largest gap between opposing portions of surface 301 of component 300 along the Z-axis in the final stage 100-6 of assembly 100 may be no larger than the gap between opposing portions of surface 301 of component 300 along surface 205 of component 200 in the final stage 100-6 of assembly 100 (e.g., no larger than the gap between the first coupling at contacts 202/302 and the second coupling at contacts 208/308).

FIG. 8 is a flowchart of an illustrative process 800 for forming a system with at least one reinforced coupling (e.g., stage 100-6 of assembly 100). At operation 802 of process 800, a reinforcement component may be provided in an initial configuration on a surface of a first component portion (e.g., reinforcement component 600 may be provided in initial configuration 600-1 on surface 301 of a first portion of component 300). At operation 804 of process 800, a first coupling may be created between one of (1) a contact of the first component portion at the surface of the first component portion and (2) a contact of a second component portion at a surface of the second component portion and a contact of a third component portion at a surface of the third component portion (e.g., a first coupling may be created between a contact on a first portion of surface 301 of component 300 and a contact of a first surface 201 of component 200 (e.g., between contacts 302 and 202) or between a contact on a second portion of surface 301 of component 300 and a contact of a second surface 209 of component 200 (e.g., between contacts 308 and 208)). At operation 806 of process 800, a second coupling may be created between the other one of (1) the contact of the first component portion and (2) the contact of the second component portion and a contact of a fourth component portion at a surface of the fourth component portion (e.g., a second coupling may be created between the first portion of surface 301 of component 300 and the contact of first surface 201 of component 200 (e.g., between contacts 302 and 202) or between the contact on the second portion of surface 301 of component 300 and the contact of the second surface 209 of component 200 (e.g., between contacts 308 and 208)). At operation 808 of process 800, the reinforcement component may be deformed, between the first component portion and the second component portion, from the initial configuration of the reinforcement component into a deformed configuration of the reinforcement component for reinforcing at least one of the first coupling and the second coupling (e.g., reinforcement component 600 may be deformed between different portions of component 300 from initial configuration 600-1 to deformed configuration 600-2 for reinforcing at least one of the coupling between contacts 302 and 202 and the coupling between contacts 308 and 208).

It is understood that the operations shown in process 800 of FIG. 8 are only illustrative and that existing operations may be modified or omitted, additional operations may be added, and the order of certain operations may be altered. For example, operation 802 may occur before or during or after operation 804 but before operation 806. Operation 804 may occur before or during operation 806. Operation 808 may occur after operations 804 and 806, or during operations 804 and 806, or during operation 806.

Figure 9:
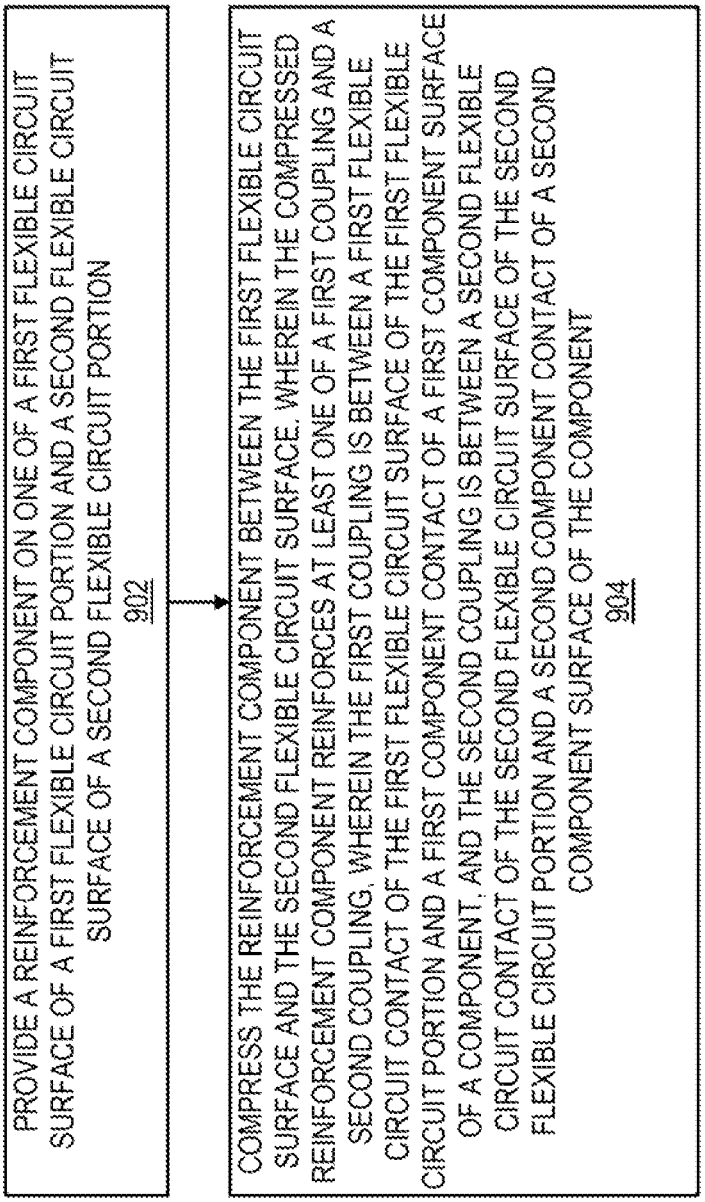

FIG. 9 is a flowchart of an illustrative process 900 for protecting at least one of a plurality of couplings, wherein the plurality of couplings includes (1) a first coupling between a first flexible circuit contact of a first flexible circuit surface of a first flexible circuit portion and a first component contact of a first component surface of a component and (2) a second coupling between a second flexible circuit contact of a second flexible circuit surface of a second flexible circuit portion and a second component contact of a second component surface of the component (e.g., a first coupling between contact 302 of component 300 and contact 202 of component 200 and a second coupling between contact 308 of component 300 and contact 208 of component 300). At operation 902 of process 900, a reinforcement component may be provided on one of the first flexible circuit surface and the second flexible circuit surface (e.g., reinforcement component 600 may be provided on a portion of surface 301 of component 300). After operation 902, at operation 904 of process 900, the reinforcement component may be compressed between the first flexible circuit surface and the second flexible circuit surface, wherein the compressed reinforcement component reinforces at least one of the first coupling and the second coupling (e.g., reinforcement component 600 may be compressed between different portions of component 300 (e.g., from configuration 600-1 to configuration 600-2) such that component 600 may reinforce at least one of a first coupling between contact 302 of component 300 and contact 202 of component 200 and a second coupling between contact 308 of component 300 and contact 208 of component 300).

It is understood that the operations shown in process 900 of FIG. 9 are only illustrative and that existing operations may be modified or omitted, additional operations may be added, and the order of certain operations may be altered.

While there have been described reinforcement components for electrical connections with limited accessibility and systems and methods for making the same, it is to be understood that many changes may be made therein without departing from the spirit and scope of the subject matter described herein in any way. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms, such as "up" and "down," "front" and "back," "top" and "bottom" and "side," "above" and "below," "length" and "width" and "thickness" and "diameter" and "cross-section" and "longitudinal," "X-" and "Y-" and "Z-," and the like, may be used herein only for convenience, and that no fixed or absolute directional or orientational limitations are intended by the use of these terms. For example, the components of the reinforcement component can have any desired orientation. If reoriented, different directional or orientational terms may need to be used in their description, but that will not alter their fundamental nature as within the scope and spirit of the invention.

Therefore, those skilled in the art will appreciate that the invention can be practiced by other than the described embodiments, which are presented for purposes of illustration rather than of limitation.

What is claimed is:

1. A method for protecting at least one of a plurality of couplings, wherein the plurality of couplings comprises (1) a first coupling between a first flexible circuit contact of a first flexible circuit surface of a first flexible circuit portion and a first component contact of a first component surface of a component and (2) a second coupling between a second flexible circuit contact of a second flexible circuit surface of a second flexible circuit portion and a second component contact of a second component surface of the component, the method comprising:
    providing a reinforcement component on one of the first flexible circuit surface and the second flexible circuit surface; and
    after the providing, compressing the reinforcement component between the first flexible circuit surface and the second flexible circuit surface, wherein the compressed reinforcement component reinforces at least one of the first coupling and the second coupling.

2. The method of claim 1, further comprising, prior to the providing, bonding the first component contact and the first flexible circuit contact to create the first coupling.

3. The method of claim 2, further comprising, prior to the providing, bonding the second component contact and the second flexible circuit contact to create the second coupling.

4. The method of claim 3, wherein the bonding the first component contact and the bonding the second component contact are simultaneous.

5. The method of claim 1, further comprising, after the providing but prior to the compressing, bonding the first component contact and the first flexible circuit contact to create the first coupling.

6. The method of claim 1, further comprising, during the compressing, bonding the first component contact and the first flexible circuit contact to create the first coupling.

7. The method of claim 1, wherein the compressed reinforcement component reinforces each one of the first coupling and the second coupling.

8. The method of claim 1, further comprising, no later than during the compressing, bonding the first component contact and the first flexible circuit contact to create the first coupling, wherein:
    the bonding the first component contact and the first flexible circuit contact comprises:
        flowing an adhesive material between the first component contact and the first flexible circuit contact; and
        curing the flowing adhesive material; and
    the compressed reinforcement component contacts the cured adhesive material.

9. The method of claim 8, further comprising, no later than during the compressing, bonding the second component contact and the second flexible circuit contact to create the second coupling, wherein:
    the bonding the second component contact and the second flexible circuit contact comprises:
        flowing another adhesive material between the second component contact and the second flexible circuit contact; and
        curing the flowing other adhesive material; and
    the compressed reinforcement component contacts the cured other adhesive material.

10. The method of claim 1, wherein the first flexible circuit surface of the first flexible circuit portion and the second flexible circuit surface of the second flexible circuit portion are the same surface of a single flexible circuit.

11. The method of claim 1, wherein the providing comprises laminating the reinforcement component to the one of the first flexible circuit surface and the second flexible circuit surface.

12. The method of claim 1, further comprising heating the reinforcement component during the compressing.

13. The method of claim 1, wherein the compressing moves a portion of the reinforcement component to contact the at least one of the first coupling and the second coupling.

14. The method of claim 1, wherein:
prior to the compressing, the reinforcement component is distanced from a portion of the at least one of the first coupling and the second coupling by a gap; and
the compressing causes the compressed reinforcement component to span the gap and contact the portion of the at least one of the first coupling and the second coupling.

15. A method for forming a system with at least one reinforced coupling, the method comprising:
providing, on a surface of a first component portion, a reinforcement component in an initial configuration of the reinforcement component;
creating a first coupling between one of (1) a contact of the first component portion at the surface of the first component portion and (2) a contact of a second component portion at a surface of the second component portion and a contact of a third component portion at a surface of the third component portion;
creating a second coupling between the other one of (1) the contact of the first component portion and (2) the contact of the second component portion and a contact of a fourth component portion at a surface of the fourth component portion; and
deforming, between the first component portion and the second component portion, the reinforcement component from the initial configuration of the reinforcement component into a deformed configuration of the reinforcement component for reinforcing at least one of the first coupling and the second coupling.

16. The method of claim 15, wherein:
the surface of the first component portion and the surface of the second component portion are the same surface of a first component;
the surface of the third component portion and the surface of the fourth component portion are different surfaces of a second component; and
before the creating the second coupling, folding the first component to align the other one of the contact of the first component portion and the contact of the second component portion with the contact of the fourth component portion.

17. An assembly comprising:
a first electronic component comprising:
a first contact on a top surface of the first electronic component; and
a second contact on a bottom surface of the first electronic component;
a second electronic component comprising:
a third contact on a first portion of a surface of the second electronic component; and
a fourth contact on a second portion of the surface of the second electronic component; and
a reinforcement component held between the first portion of the surface of the second electronic component and the second portion of the surface of the second electronic component, wherein:
the first contact is coupled to the third contact at a first coupling;
the second contact is coupled to the fourth contact at a second coupling; and
a maximum height gap between the first portion of the surface of the second electronic component and the second portion of the surface of the second electronic component is defined by a height between the first coupling and the second coupling.

18. The assembly of claim 17, wherein a flowable temperature range of a coupling component that couples the first contact to the third contact at the first coupling is offset from a flowable temperature range of the reinforcement component by less than 15° Celsius.

19. The assembly of claim 17, wherein a curing temperature range of a coupling component that couples the first contact to the third contact at the first coupling is offset from a curing temperature range of the reinforcement component by less than 15° Celsius.

20. The assembly of claim 19, wherein a flowable temperature range of the coupling component that couples the first contact to the third contact at the first coupling is offset from a flowable temperature range of the reinforcement component by less than 15° Celsius.

* * * * *